(12) United States Patent  
Park

(10) Patent No.: US 7,227,791 B2
(45) Date of Patent: Jun. 5, 2007

(54) SEMICONDUCTOR MEMORY DEVICE INCLUDING CIRCUIT TO STORE ACCESS DATA

(75) Inventor: Gi-Ho Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/181,144

(22) Filed: Jul. 13, 2005

(65) Prior Publication Data

US 2006/0013057 A1    Jan. 19, 2006

(30) Foreign Application Priority Data

Jul. 16, 2004 (KR) .................. 10-2004-0055638

(51) Int. Cl.
*G11C 7/10* (2006.01)
(52) U.S. Cl. .............. 365/189.08; 365/191; 365/154
(58) Field of Classification Search ............ 365/189.08
See application file for complete search history.

(56) References Cited

U.S. PATENT DOCUMENTS

| 5,214,606 | A * | 5/1993 | Hashimoto ............. 365/185.22 |
| 5,355,345 | A * | 10/1994 | Dickinson et al. ..... 365/230.01 |
| 6,173,356 | B1 * | 1/2001 | Rao ............... 711/5 |
| 6,556,491 | B2 * | 4/2003 | Otsuka et al. .............. 365/201 |
| 6,597,610 | B2 | 7/2003 | Houston |
| 6,597,624 | B2 * | 7/2003 | Aritomi ................. 365/230.06 |
| 6,807,124 | B2 * | 10/2004 | Tsuda et al. ........... 365/230.03 |
| 6,950,368 | B2 * | 9/2005 | Morgan ................... 365/230.03 |
| 2002/0114207 | A1 * | 8/2002 | Takeuchi et al. ....... 365/230.03 |
| 2002/0191467 | A1 * | 12/2002 | Matsumoto et al. ........ 365/222 |
| 2004/0008564 | A1 | 1/2004 | Tsuda et al. |
| 2004/0042326 | A1 | 3/2004 | Ashizawa |

FOREIGN PATENT DOCUMENTS

| EP | 0913773 A1 | 5/1999 |
| JP | 08-045275 | 2/1996 |
| JP | 2004-047003 | 2/2004 |
| JP | 2004-095027 | 3/2004 |
| KR | 19960015592 | 5/1996 |

OTHER PUBLICATIONS

English language abstract of the Japanese Publication No. 08-045275.
English language abstract of the Japanese Publication No. 2004-047003.
English language abstract of the Japanese Publication No. 2004-095027.

* cited by examiner

*Primary Examiner*—Amir Zarabian
*Assistant Examiner*—Kretelia Graham
(74) *Attorney, Agent, or Firm*—Marger Johnson & McCollom, P.C.

(57) ABSTRACT

We describe a semiconductor memory device including a memory cell array and a storage device to store access data. The memory cell array is accessed responsive to the access data. The memory cell array access is determined by the access data stored in the storage device. The memory cell array is accessed according to access data only if necessary, drastically reducing power dissipation.

19 Claims, 2 Drawing Sheets

SEMICONDUCTOR MEMORY DEVICE INCLUDING CIRCUIT TO STORE ACCESS DATA

This application claims priority from Korean Patent Application No. 2004-55638, filed on Jul. 16, 2004, the contents of which we incorporate by reference.

FIELD

This invention generally relates to semiconductor devices and, more specifically, to a semiconductor memory device including a circuit for storing access data.

BACKGROUND

Semiconductor memory devices have been widely used as main memories in computers, embedded memories and cache memories in microprocessors. Semiconductor memory devices are classified into RAM (Random Access Memory) and ROM (Read Only Memory) devices.

A RAM device is a memory device capable of storing written data and reading the stored data. A RAM device is a volatile memory that does not keep stored data when power is off. Typical examples of RAM devices are Dynamic RAM (DRAM) and Static RAM (SRAM).

A ROM device is only capable of reading stored data. A ROM device is a non-volatile memory that keeps stored data even if the power is off. ROM devices are classified as Programmable ROMS (PROM) and One Time Programmable ROMS (OT-PROM). PROM devices, in turn, are classified as Erasable PROM (EPROM) and Electrically EPROMS (EEPROM). An example of nonvolatile ROM devices is a Flash memory. Flash memories are capable of high integration.

Typical semiconductor memory devices comprise a memory cell array, a row decoder, a column decoder, and a sense amplifier circuit. The memory cell array has several memory cells arranged in a matrix with word and bit lines. The row decoder receives a row address to select the word line. The column decoder receives a column address to select a bit line. The sense amplifier circuit senses and amplifies a voltage from the bit line to read data of the selected memory cell.

In the semiconductor memory device with the above-mentioned structure, if the word line is active, several memory cells are accessed. In certain situations, even if the word line is active, it is undesirable to access all the memory cells connected to the word line.

An example of this situation is a branch target buffer used in branch prediction. The branch target buffer is generally an SRAM. An address of a branch command and a target address are stored in a memory cell array. The branch target buffer accesses the memory cells connected to the word line by activating the selected word line for taken branches as well as not-taken branches. Where branches are taken, the branch target buffer accesses the memory cell array to read the stored target address and then fetches a command of the pertinent target address. Where branches are not taken, the branch target buffer does not fetch the command of the target address. But if branches are not taken, the branch target buffer unnecessarily accesses the memory cell array, leading to wasted power.

As portable devices (e.g., portable personal computers, cell phones, personal digital assistants (PDA) and so forth) employing semiconductor memory devices become more widespread, power consumption reductions are actively developed. As power supplied to operate portable devices becomes more and more reduced, there is an increasing need to reduce power consumption. Since needlessly accessed memory cell arrays waste power, its elimination is desirable.

SUMMARY

We describe a semiconductor memory device including a memory cell array and a storage device to store access data. The memory cell array is accessed responsive to the access data.

The storage device is connected to word lines of the memory cell array and the storage device includes memory cells that each store 1-bit data. A decoder receives an address to select a word line and to provide a word line voltage to the selected word line. A logic gate to provide a word line voltage supplied from the decoder to the memory cell array responsive to the access data.

The logic gate is an AND gate that receives the word line voltage and the access data. To provide the word line voltage supplied from the decoder to the memory cell array responsive to the access data stored and an operating mode.

The logic gate comprises an OR gate to receive the access data and the operating mode and an AND gate to receive the word line voltage and an output of the OR gate. The logic gate provides the word line voltage to the memory cell array regardless of the access data when the operating mode is a write mode. The memory cell array is a SRAM memory cell array.

The storage device is connected to a word line of the SRAM memory cell array, respectively, and is a SRAM cell to store 1-bit data.

DETAILED DESCRIPTION

Exemplary embodiments will be described more fully with reference to the accompanying drawings.

Figure 1:
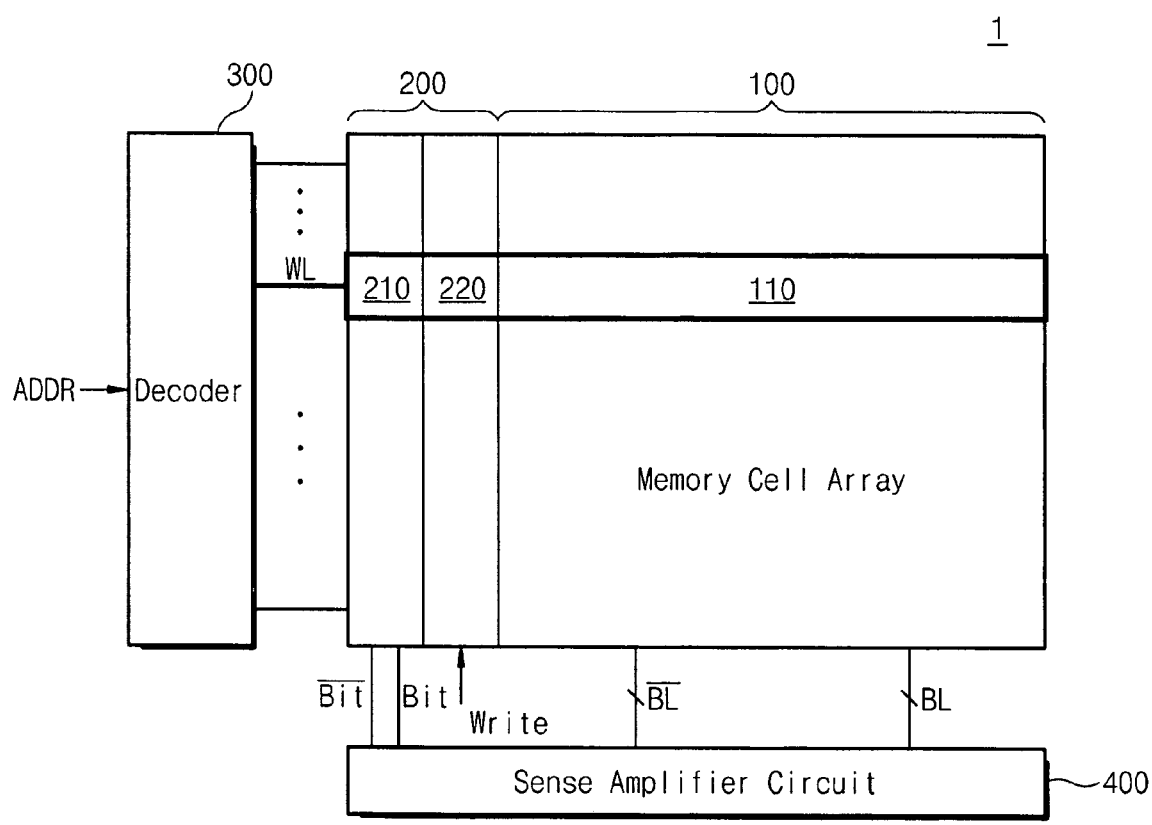
FIG. 1 is block diagram of an embodiment of a semiconductor memory device.

FIG. 1 is a block diagram showing an embodiment of a semiconductor memory device. The semiconductor device 1 includes a memory cell array 100, a word line gate circuit 200, a decoder 300, and a sense amplifier circuit 400.

The memory cell array 100 can be variously embodied according to a type of cell. For instance, a DRAM cell includes a capacitor coupled to a transistor for storing data. The transistor functions as a switch. An SRAM cell includes two PMOS transistors and four NMOS transistors. A plurality of memory cells exist (DRAM, SRAM, and so forth) that are connected to a word line and a bit line arranged in a matrix in the memory cell array 100.

The decoder 300 receives an address ADDR to select a word line and then applies a word line voltage to the selected word line WL.

A word line gating circuit 200 is located between the memory cell array 100 and the decoder 300. The word line gating circuit 200 is a storage device for storing access data. The access data determines whether the memory cell array 100 is accessed or not. The word line gating circuit 200 may include a memory cell 210 and a logic gate 220 as shown in more detail in FIG. 2.

The memory cell 210 stores access data. The memory cell 210 is any storage device including DRAM, SRAM, and the like. The memory cell 210 is connected to a plurality of word lines provided to the memory cell array 100. In an embodiment, the memory cell 210 stores 1-bit access data.

The logic gate 220 provides a word line voltage to the memory cell array 100 responsive to access data. For instance, if the access data stored in the memory cell 210 is "1", the logic gate 220 provides the word line voltage applied from the decoder 300 to the memory cell array 100. If the access data is "0", on the other hand, the logic gate 220 does not provide the word line voltage to the memory cell array 100, thereby avoiding unnecessary wasteful power cell accesses.

The logic gate 220 can be embodied so as to provide the word line voltage to the memory cell array 100 responsive to access data as well as an operating mode. That is, if an operating mode is a write mode according to a control signal (e.g., write) in FIG. 1, the logic gate provides the word line voltage to the memory cell array regardless of access.

The sense amplifier circuit 400 is connected through bit lines BL, /BL, Bit, and /Bit to the memory cell array 100 and the memory cell 210. The sense amplifier circuit 400 senses and amplifies a voltage of the bit lines BL, /BL, Bit, and /Bit. FIG. 1 shows only a couple of bit lines but many more may be included as is well known. The semiconductor memory device is not limited to this embodiment and applicable where one memory cell is connected to one bit line (e.g., a flash memory).

Figure 2:
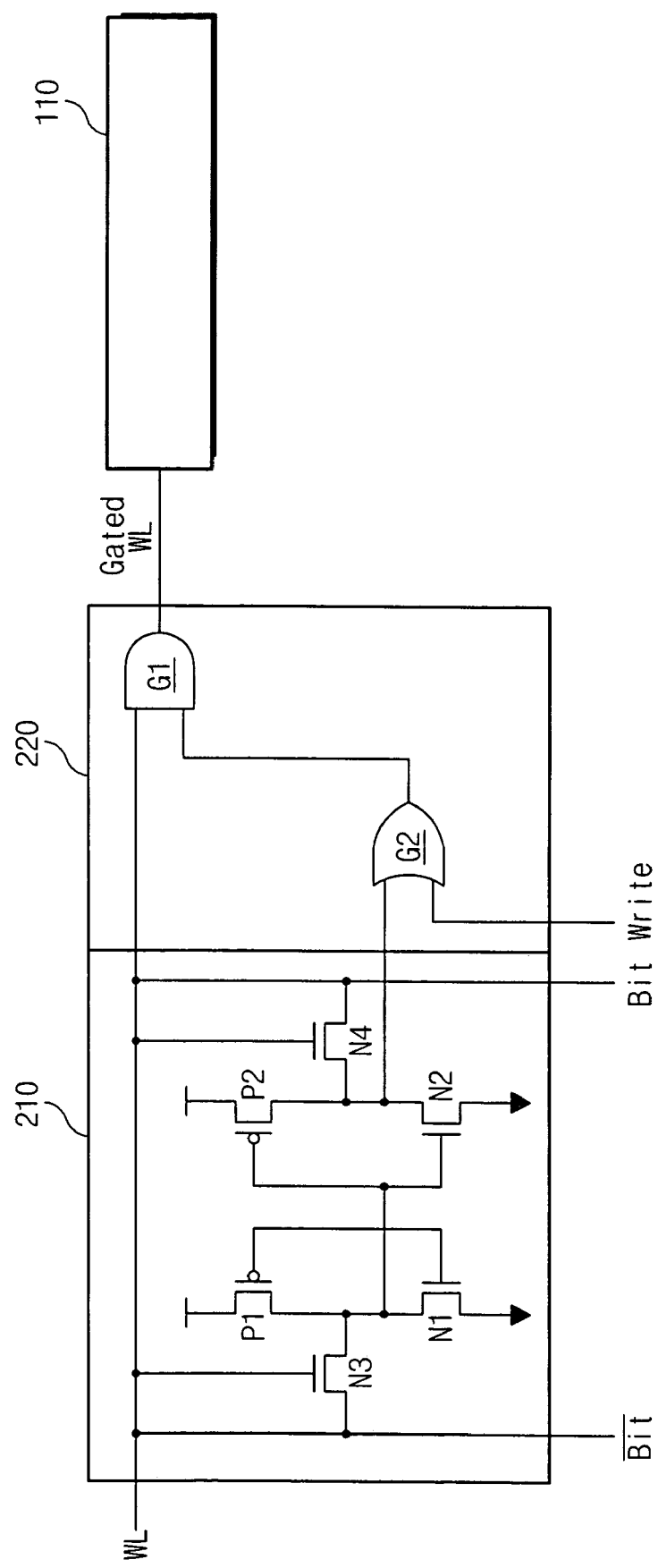
FIG. 2 is a circuit diagram showing the word line gating circuit shown in FIG. 1.

FIG. 2 is a circuit diagram showing a preferred embodiment of the word line gating circuit 200 shown in FIG. 1. Referring to FIG. 2, the word line gating circuit 200 is connected to the decoder 300 (see FIG. 1) by the word line WL and is connected to the memory cell array 110 by a word line Gated WL. In addition, the word line gating circuit 200 is connected to the sense amplifier circuit 400 (see FIG. 1) by a couple of bit lines Bit and /Bit. The circuit 200 includes the memory cell 210 and the logic gate 220.

In FIG. 2, the memory cell 210 is a SRAM cell that stores 1-bit data. The SRAM cell 210 is a general SRAM cell, including two PMOS transistors P1 and P2, and four NMOS transistors N1~N4. Access data is stored in the 1-bit SRAM cell 210. The memory cell array 110 is accessed responsive to the access data. In an embodiment, the memory cell 210 is a SRAM cell, the memory cell array 110 is a memory cell array of a SRAM memory and includes a plurality of SRAM cells connected to the word line Gated WL. If the memory cell 210 is a DRAM cell, the memory cell array 110 is constituted with a plurality of DRAM cells connected to the word line Gated WL.

The logic gate 220 is includes one AND gate G1 and one OR gate G2. The AND gate G1 has two input terminals and one output terminal. One input terminal is connected to a word line WL, and the other input terminal is connected to an output terminal of the OR gate G2. The OR gate G2 has two input terminals and one output terminal. One input terminal is connected to an output terminal of the SRAM cell 210, the other input terminal receives a control signal (e.g., write).

In the word line gating circuit 200 where the access data stored in the SRAM cell 210 is "1", the output of the OR gate G2 is always "1". As a result, if the word line WL is active, the Gated WL wordline is active. Where access data is "1", if the word line WL becomes active, the memory cell array 110 is accessed. Where the control signal (Write) is not active, if data stored in the SRAM cell 210 is "0", an output of the OR gate G2 becomes "0". Thus, the output of the AND gate G1 becomes "0" so that a voltage applied to the word line WL is not provided to the word line Gated WL. Consequently, the memory cell array 110 is not accessed.

On the other hand, where the control signal (Write) becomes active, an output of the OR gate G2 is "1". As a result, the voltage applied to the word line WL is provided to the word line Gated WL regardless of the access data stored in the SRAM cell 210.

The semiconductor memory device according to the present invention has the word line gating circuit 200 for storing access information in a word line that is respectively connected to the memory cell array 100. Where the access data stored in the word line gating circuit 200 is "0", the memory cell array is not accessed. However, since there is a request to perform a write operation regardless of the access data during the write operation, the memory cell array is accessed.

In accordance with the semiconductor memory device of the present invention, if access information stored in the word line gating circuit is "0", the memory cell array is not accessed. Therefore, it is possible to reduce power consumption caused by unnecessarily accessing the memory cell array. In addition, now that access information is stored in each of the word lines connected to the memory cell array, power consumption of the semiconductor memory device can be reduced by only controlling the word line without a complex control circuit and a large amount of delay time.

As previously mentioned, it is possible to dramatically reduce power consumption of semiconductor devices by including means for storing access information in each of word lines that is connected to the memory cell array.

Changes can be made to the invention in light of the above detailed description. The terms used here should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

I claim:

1. A semiconductor memory device, comprising:
   a memory cell array;
   a storage device to store access data; and
   a logic gate including an OR gate to receive the access data and an operating mode, and an AND gate to receive a word line voltage and an output of the OR gate, where the memory cell array is accessed responsive to an output of the AND gate.

2. The semiconductor memory device of claim 1 where the storage device is connected to word lines of the memory cell array; and
   where the storage device includes memory cells that each store 1-bit data.

3. The semiconductor memory device of claim 2 comprising a decoder to receive an address to select a word line and to provide the word line voltage to the selected word line.

4. The semiconductor memory device of claim 3 where the logic gate is configured to provide the word line voltage supplied from the decoder to the memory cell array responsive to the access data.

5. The semiconductor memory device of claim 4 where the logic gate provides the word line voltage to the memory cell array regardless of the access data when the operating mode is a write mode.

6. The semiconductor memory device of claim 3 where the logic gate is configured to provide the word line voltage supplied from the decoder to the memory cell array responsive to the access data stored and an operating mode.

7. A semiconductor memory device, comprising:
a memory cell array;
a storage device to store access data;
where the memory cell array is accessed responsive to the access data;
where the storage device is connected to word lines of the memory cell array;
where the storage device includes memory cells that each store 1-bit data;
a decoder to receive an address to select a word line and to provide a word line voltage to the selected word line; and
a logic gate to provide the word line voltage supplied from the decoder to the memory cell array responsive to the access data stored and an operating mode;
where the logic gate comprises
an OR gate to receive the access data and the operating mode; and
an AND gate to receive the word line voltage and an output of the OR gate.

8. The semiconductor memory device of claim 7 where the logic gate provides the word line voltage to the memory cell array regardless of the access data when the operating mode is a write mode.

9. The semiconductor memory device of claim 1 where the memory cell array is a SRAM memory cell array.

10. The semiconductor memory device of claim 9 where the storage device is connected to a word line of the SRAM memory cell array, respectively, and is a SRAM cell to store 1-bit data.

11. A semiconductor memory device comprising:
a memory cell array;
a decoder to receive an address to select a word line and to provide a word line voltage to the selected word line;
a storage device to store access data; and
a logic gate to provide the word line voltage to the memory cell array responsive to the access data and a write signal, the write signal to indicate a type of memory access operation for the memory cell array, where the logic gate is configured to provide the word line voltage to the memory cell array regardless of the access data when the write signal is activated, and where the logic gate is configured to provide the word line voltage to the memory cell array responsive to the access data when the write signal is deactivated.

12. The semiconductor memory device of claim 11 where the storage device is a memory cell to store 1-bit data.

13. The semiconductor memory device of claim 11 where the logic gate is an AND gate to receive the word line voltage and the access data to provide the word line voltage to the memory cell.

14. A semiconductor memory device comprising:
a memory cell array;
a decoder to receive an address to select a word line and to provide a word line voltage to the selected word line;
a storage device to store access data;
a logic gate to provide the word line voltage to the memory cell array responsive to the access data;
where the logic gate provides the word line voltage to the memory cell array responsive to the access data and an operating mode; and
where the logic gate comprises
an OR gate to receive the access data and the operating mode; and
an AND gate to receive the word line voltage and an output of the OR gate.

15. The semiconductor memory device of claim 14 where the logic gate provides the word line voltage to the memory cell array regardless of the access data when the operating mode is a write mode.

16. The semiconductor memory device of claim 11 where the memory cell array is a SRAM memory cell array.

17. The semiconductor memory device of claim 16 where the storage device is connected to a word line of the SRAM memory cell array, respectively, and is a SRAM cell to store 1-bit data.

18. The semiconductor memory device of claim 11 where the memory cell array is a DRAM memory cell array.

19. The semiconductor memory device of claim 17 where the storage device is connected to a word line of the DRAM memory cell, respectively, and is a DRAM cell to store 1-bit data.

* * * * *

UNITED STATES PATENT AND TRADEMARK OFFICE
CERTIFICATE OF CORRECTION

| | |
|---|---|
| PATENT NO. | : 7,227,791 B2 |
| APPLICATION NO. | : 11/181144 |
| DATED | : June 5, 2007 |
| INVENTOR(S) | : Gi-Ho Park |

It is certified that error appears in the above-identified patent and that said Letters Patent is hereby corrected as shown below:

Column 6, line 38, the word "17" should read -- 18 --.

Signed and Sealed this

Fifth Day of August, 2008

JON W. DUDAS
*Director of the United States Patent and Trademark Office*